United States Patent [19]

Stachniak

[11] 3,955,981

[45] May 11, 1976

[54] METHOD OF FORMING ELECTRON-TRANSMISSIVE APERTURES IN A COLOR SELECTION MASK BY PHOTOETCHING WITH TWO RESIST LAYERS

[75] Inventor: Raymond M. Stachniak, Chicago, Ill.

[73] Assignee: Zenith Radio Corporation, Chicago, Ill.

[22] Filed: Jan. 6, 1975

[21] Appl. No.: 538,846

[52] U.S. Cl. .................................... 96/36.1; 96/36; 156/11
[51] Int. Cl.² ........................................ G03C 5/00
[58] Field of Search ................... 96/36.1, 36; 156/8, 156/11; 313/85 S

[56] References Cited
UNITED STATES PATENTS

| | | | |
|---|---|---|---|
| 3,652,895 | 3/1972 | Tsuneta et al. | 96/36.1 X |
| 3,653,900 | 4/1972 | Black | 96/36.1 |
| 3,721,592 | 3/1973 | De Werdt | 156/11 |
| 3,794,873 | 2/1974 | Kaplan | 313/85 S |
| 3,905,079 | 9/1975 | Kanai et al. | 96/36.1 X |

*Primary Examiner*—Edward C. Kimlin
*Attorney, Agent, or Firm*—John H. Coult

[57] ABSTRACT

A method of forming electron-transmissive apertures in a color selection mask for use in a color cathode ray tube. The method includes providing an electrically conductive preformed blank having a relatively thin aperture-defining layer and a relatively thick substrate layer. Two photoresist layers are deposited in succession on the aperture-defining layer. The first photoresist layer is caused to have an array of aperture elements, said pattern elements having the desired ultimate mask aperture size. The second photoresist layer is caused to have an array of aperture elements which are superimposed over the array of aperture elements in the first photoresist coating and correspondingly distributed, a predetermined group of the said aperture elements being of a smaller size than the desired ultimate mask aperture size. The shadow mask blank is then etched through, using the array of apertures in the second photoresist coating as an etchant mask. The second photoresist layer is then stripped and the bared portions of the aperture-defining layer in the mask blank are etched in a second etching operation to thereby produce a mask blank in which is formed the ultimate sized and shaped electron-transmissive apertures.

8 Claims, 19 Drawing Figures

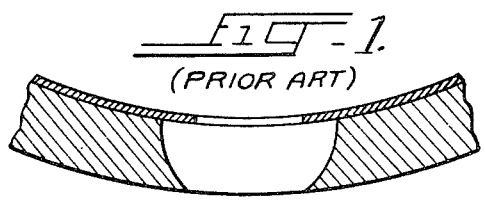
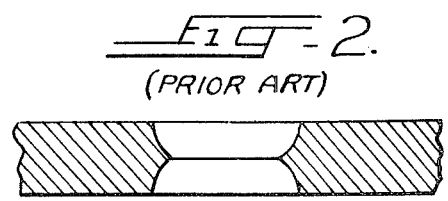
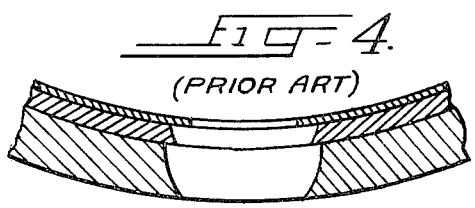
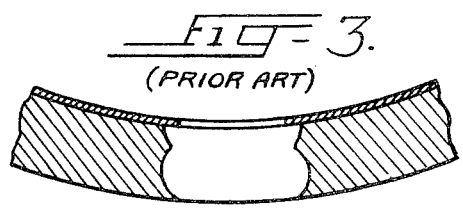
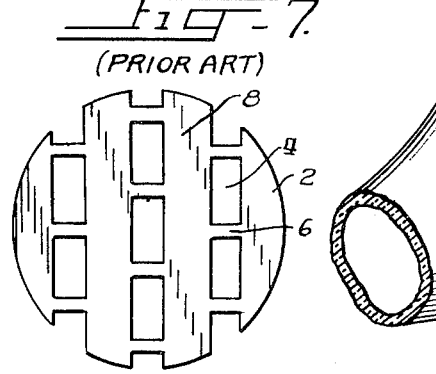
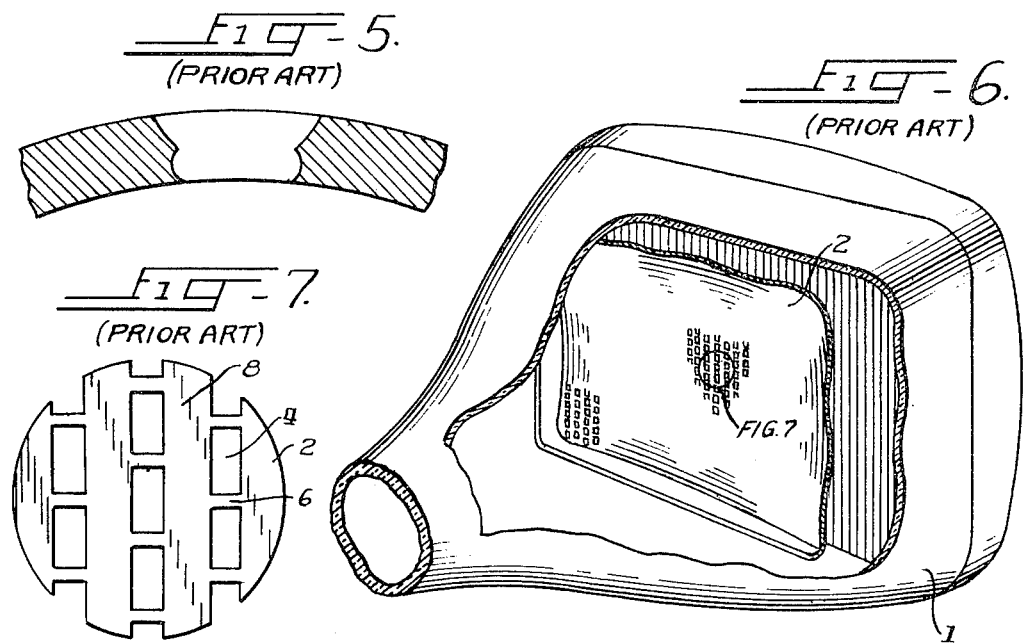
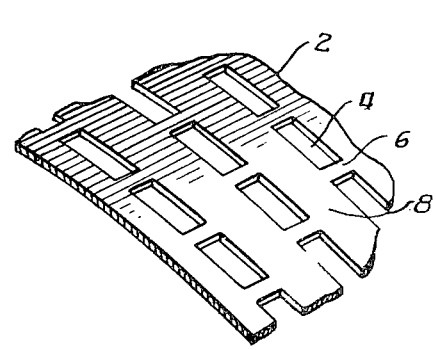
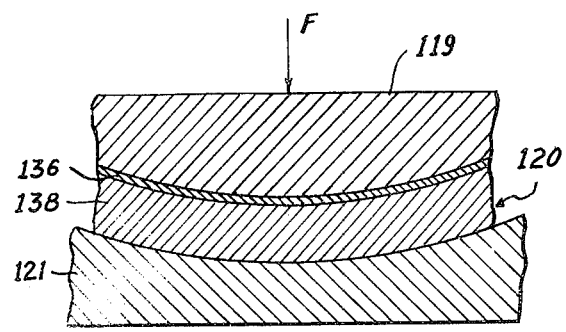

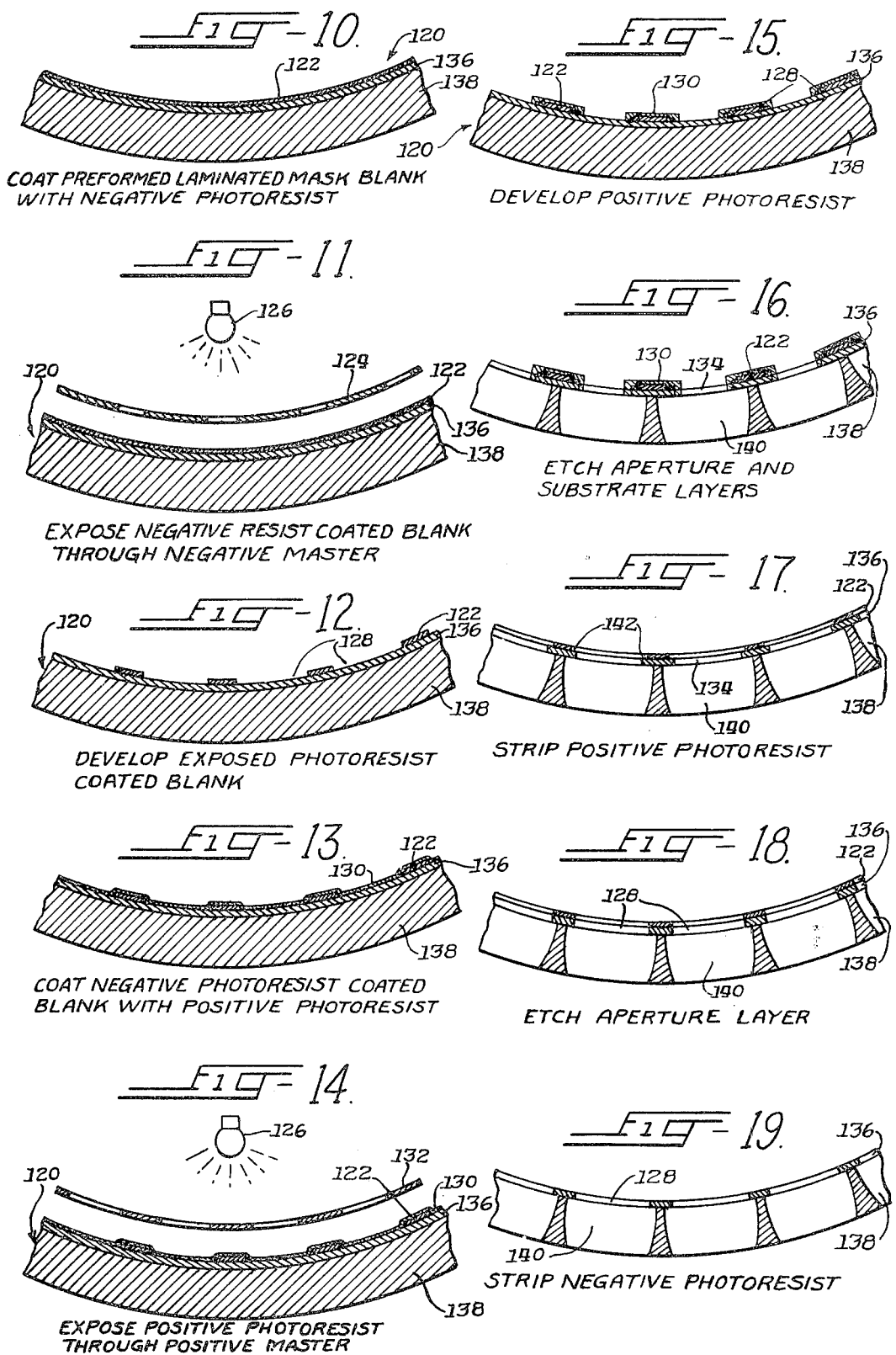

METHOD OF FORMING ELECTRON-TRANSMISSIVE APERTURES IN A COLOR SELECTION MASK BY PHOTOETCHING WITH TWO RESIST LAYERS

CROSS-REFERENCE TO RELATED APPLICATIONS

This application relates to, but is in no way dependent upon, copending applications Ser. No. 466,102, filed May 2, 1974 in the name of R. Stachniak and Ser. No. 471,420, filed May 30, 1974 in the name of K. Palac, both having a common assignee herewith. This application further relates to, but is in no way dependent upon, copending applications Ser. No. 512,583, filed Oct. 7, 1974 and Ser. No. 520,836, filed Nov. 4, 1974, both having a common assignee herewith.

BACKGROUND OF THE INVENTION

This invention relates generally to cathode ray tubes for color television and specifically to construction of improved color selection masks therefor.

Every commercial color television cathode ray tube today includes a color selection mask which allows a selected pattern of electrons to impinge upon a corresponding pattern of light-emitting phosphor elements deposited on a cathode ray tube panel. A typical color selection mask is of the shadow mask variety, comprising a thin sheet of steel having a pattern of electron-transmissive apertures etched therein. The apertures take various forms, although typically take the form of small round holes or vertical rows of aligned slots.

Naturally, it has been desirable to etch the mask apertures as accurately as possible in order to provide each mask with accurately positioned apertures having a predetermined size and shape.

The most straight-forward method of forming the mask apertures would be to coat one side of the mask blank with an etchant-resistant coating in which there is a pattern of holes through which an etchant may be applied to the blank. The blank would then be etched by spraying an etchant onto the portion of the blank surface not protected by the etchant-resistant coating. This spray would be continued until the etchant mills a hole through the blank. Since this method of forming mask apertures would include etching from only one side of the blank, it is referred to herein as one-sided etching. FIG. 1 is a portion of a color selection mask as it would appear if etched by such a one-sided etching process.

It has been found that it is difficult to control the size of the holes which are formed in a blank with one-sided etching. For example, variations in the thickness of a blank, which is normally made of 6 mil steel, etching non-uniformities and hole cleanliness tend to introduce undesirable variations in the size and shape of the mask apertures. A particularly undesirable characteristic of one-sided etching is that, while the etchant is creating an opening in the steel in the direction of the thickness of the blank, it is also laterally etching away or "undercutting" the metal of the blank beneath the etchant-resistant coating which lies on the surface of the blank. This undercutting continues as long as the etchant is applied to the blank and is definitely undesirable from the standpoint of mask strength. The thicker the blank, the longer the etchant must be applied to completely etch through the blank, thus a greater amount of undercutting is caused to occur during the process. Typically, an etchant will undercut or etch laterally about 0.5 mils for every 1 mil of through etching. Thus, for a 6 mil thick blank, undercutting may eat away up to 3 mils or more of the blank around each aperture.

In order to avoid the undesirably large amount of undercutting which is associated with one-sided etching, methods of etching masks from two sides have been developed and are used commercially throughout the world. Conventional methods of manufacturing color selection masks start with a flat blank sheet metal nominally 6 mils thick. Normally the first step in the etching process is to coat at least one surface of the blank with a photoresistant material. In the two-sided manufacturing process both sides of the blank are coated with the photoresist material.

Photoresist materials are of either the positive-working or negative-working type and are referred to as either positive or negative photoresists. A positive photoresist, on exposure to actinic light, undergoes changes which render it soluble in a developing solution which may be used to wash away the exposed photoresist. A negative photoresist, on exposure to actinic light, undergoes polymerization and becomes insoluble in an associated developing solution.

Although either type of photoresist may be used, for purposes of simplicity and clarity of description, the following background discussion deals exclusively with the use of a positive photoresist.

In the two-sided etching process, corresponding mask masters having predetermined related patterns of light-transmissive areas and the positive photoresist-coated blank are placed on a conventional lighthouse where an illumination pattern of electron-transmissive apertures is formed on each blank surface by exposing the photoresist coatings to actinic light transmitted through each respective mask master. The exposed areas, corresponding to the pattern of apertures, are solubilized and are washed away in a developing solution, baring the metal electrode surfaces.

An etchant is sprayed from a battery of etchant nozzles onto the opposed blank surfaces, etching those areas of the blank bared by the exposure and development processes. The etchant mills through the blank from both sides to form the desired electron-transmissive apertures in the blank, as shown in FIG. 2.

In addition to the through etching of the blank, it has been found that lateral etching or undercutting of the photoresist layer also occurs at a rate of approximately one-half the rate of the through etching; thus in a typical blank 6 mils thick the lateral etching would normally be approximately 3 mils, or 1½ mil around the aperture periphery. However, since in the two-sided process the etching etches through the blank from each side, the lateral etching is correspondingly reduced. Yet, because of this lateral etching, even though substantially reduced by the two-sided process, it is extremely difficult to control the shape of the aperture periphery. It has been found, in the manufacture of slot-type masks, to be very difficult to form tie bars which are acceptably narrow without unduly weakening the mask.

As said before, customarily aperture etching is performed on a flat sheet of electrically conductive metal. After the desired apertures have been etched, the etched mask is spherically or biradially formed to approximately the same contour as the cathode ray tube faceplate to which it is to be mated. During the forming process, varying degrees of stress are put on the blank, causing many of the apertures, especially those on the mask edges, to be deformed. The forming process consists primarily of a stamping or drawing operation which by its nature causes different stresses to be put on individual masks and mask sections. Similarly, the positioning devices for holding the mask on the forming device do not position each individual mask in the same location, thus each resulting formed mask is different from all others, causing non-uniformity in the array of apertures from mask to mask.

These stresses and the non-uniformity of the aperture array from mask to mask virtually rule out the possibility of making color selection masks that are interchangeable each with all others in the assembly of a cathode ray tube of a given size and shape. The present state of the art compensates for the deformation variations from mask to mask by uniquely mating a given mask to a given cathode ray tube faceplate. Each mask is used as the stencil or master during the photoprinting of the phosphor screen on the cathode ray tube faceplate. Thus, any irregularities in the mask are duplicated in the screen patterns formed on the faceplate. Clearly, since each mask has different aperture deformations and a non-uniform array of apertures, random interchangeability of masks and faceplates is not possible with conventional tube manufacturing methods.

It is desirable in the interest of standardizing mask aperture patterns, to perform the mask blank prior to the etching process. Etching a preformed blank would virtually eliminate aperture deformation caused by the forming process. Substantial aperture pattern uniformity from mask to mask would enable the faceplate phosphor pattern to be made with a single mask master.

The primary disadvantage of the two-sided etching approach described above is the strict requirement of hole pattern alignment needed on opposite sides of the blank to precisely form properly sized and shaped apertures. This disadvantage has the practical effect of possibly limiting the applicability of the two-sided process to flat blanks. Thus, to manufacture masks from preformed blanks enabling random interchangeability of masks and cathode ray tube faceplates, it appears that some type of one-sided etching process, avoiding the requirement of registering masters on opposite sides of a pre-contoured blank, is the practical solution.

One approach to one-sided etching of the photoresist, described and claimed in U.S. Pat. No. 3,794,873, and having a common assignee herewith, utilizes a laminated color selection mask as shown in FIG. 3 wherein typical laminants comprise a thin nickel aperture-defining layer bonded to a relatively thick substrate layer of steel. Two etchants are used — one to etch through the aperture-defining layer, hereafter referred to as an aperture layer etchant, and the other to etch through the steel substrate layer, hereafter referred to as a substrate etchant. It has been found that the severe undercutting of the aperture-defining layer which results from one-sided etching is somewhat reduced by this method. The substrate reacts quickly to the substrate etchant and slowly to the aperture layer etchant and the aperture-defining layer reacts similarly to the respective aperture etchant and substrate etchant. The respective reaction times reduce the overall etching time for etching through the blank, thereby reducing the time the etchant is in contact with the respective layers and resulting in reduced undercutting in the substrate. However, a serious problem still exists in the manufacture of slot-type masks where narrow tie bars (e.g., 4 mils or less) must be formed.

The severe undercutting associated with one-sided etching has led to alternative methods of one-sided etching for color selection masks. In one method, described and claimed in the referent application Ser. No. 466,102, to avoid this severe undercutting and the registration problems associated with the two-sided etching process, a laminated color selection mask blank is coated on one side with an etchant-resistant coating. A typical laminate mask blank may comprise a ½ mil aperture-defining layer of nickel, a 1½ mil core layer of copper alloy, and a 4 mil steel substrate, as shown in FIG. 4. After the etchant-resistant coating is applied, an aperture array is made by exposing the photoresist coating, through a master, to actinic light and developing the exposed areas. An etchant, which may be ferric chloride, is then applied to the blank. The first etchant chemically etches the aperture-defining layer and the core layer. After a wash process, a second etchant, typically ferric sulfate, is applied to the partially etched mask blank. The nickel aperture-defining layer and the copper core layer, being impervious to ferric sulfate, resist etching while the steel substrate is being etched. Reduced undercutting results. This process of etching has formerly been labeled a laminated coring one-sided etching process.

Another method of performing one-sided etching without producing severe undercutting, described and claimed in the referent application Ser. No. 417,420, uses a laminate mask blank which may be composed of a ½ mil nickel aperture-defining layer bonded to a 6 mil substrate of steel. See FIG. 3 for basic construction of a blank used in this method. The color selection mask blank is first coated with a photoresist and etched with an etchant, typically ferric chloride. After the first etching process the blank, including the cavities etched by the first etchant, is again coated with a photoresist material (preferably of the positive-working type) and the cavity bottoms only are subsequently exposed to ultraviolet light. Upon development of the photoresist, the unexposed photoresist is retained on the surface of the mask blank and the undercut portions of the cavity, leaving exposed only that portion of the cavity exposed (on the second exposure) to the ultraviolet irradiation. Upon application of a second etchant such as ferric sulfate, the substrate is etched through. The resulting mask aperture profile is not shown, but is similar to that shown in FIG. 4. The same method may be used on a single layered blank, as shown in FIG. 5, a method where the etching is from the convex side of the preformed blank.

Each of the prior art methods of one-sided etching represent improvements in the basic one-sided aperture etching process, but have been found not to be completely satisfactory in every respect. The myriad of problems associated with one-sided etching, the most severe being the undercutting problem, has before this invention made one-sided etching a difficult approach to etching acceptable apertures of the slot type in a preformed mask blank. In a slot-type mask, the vertically running slats separating the openings or slots in the mask through which the electrons pass on their way to the cathode ray tube screen are held together by horizontally running tie bars which, for the sake of maximized brightness and minimum moire' pattern generation, should be as narrow as possible. The one-sided etching processes known to date are not completely acceptable because of the weakened condition of the mask which results from the undercutting or etching away of the tie bar areas. To compensate for the described undercutting, and to impart sufficient strength to the mask, the tie bars have had to be made undesirably wide. This invention provides a method of etching preformed blanks maintaining narrow, structurally strong tie bars and having reduced undercutting of the aperture-defining layer.

The above discussion has dealt primarily with the problems associated with etching or shadow masks from one side and certain prior art attempts to cope with such problems, particularly in the context of shadow masks which are preformed (precontoured) before being etched (from one side). This invention has broader applicability, however.

In tubes of the negative guardband, black surround type, as explained, the electron beam landing spots are larger than the impinged phosphor elements. Since in conventional practice the shadow mask is used as the exposure stencil during the photoexposure operations used to screen the faceplate, some method must be provided for causing the electron beam spots to be larger than the impinged phosphor elements. Two methods are employed commercially. The first is the so-called "re-etch" or "etch-back" method wherein the shadow mask apertures are originally formed to the (smaller) size of the phosphor elements, and then after the screening operations, the shadow mask is "re-etched" (etched a second time) until the shadow mask apertures are larger than the phosphor elements by an allotted tolerance value, thus producing the desired negative guardband.

The second method used commercially to cause the mask apertures to be larger than the associated phosphor elements is to use a shadow mask which has full-sized apertures and, by the use, e.g., of special photoreduction or chemoreduction techniques during the screening operation, to cause the phosphor elements to be smaller than the shadow mask apertures.

By the application of this invention, there may be provided yet another commercially practicable method for making shadow mask-faceplate assemblies in which the mask apertures are ultimately larger than the associated phosphor elements.

OBJECTS OF THE INVENTION

It is a primary object of this invention to provide a master for use in the manufacture of color cathode ray tube color selection masks.

It is another object of this invention to provide an improved method of etching electron-transmissive apertures in a color cathode ray tube color selection mask.

It is still another object of this invention to provide a method for etching apertures in a color cathode ray tube mask from one side, which method offers greatly improved control of the size, shape and distribution of the apertures, and greatly reduced undesirable aperture undercutting.

It is yet another object of this invention to provide an improved process for etching slots in a slot-type cathode ray tube color selection masks, which method results in a reduced amount of undesirable undercutting of the tie bars, thus yielding narrow but strong tie bars.

It is still another object of the invention to provide an improved method of etching such slot apertures which results in precision etching of the tie bars.

It is still another object to provide a method by which apertures in a color selection mask for a color cathode ray tube can be formed with precision.

It is also an object of this invention to provide an improved method of etching apertures in a color cathode ray tube selection mask which is intended to be interchangeable between cathode ray tubes of a given size and shape.

It is yet another object of this invention to provide an improved process for etching slots in a slot-type cathode ray tube color selection mask, which method results in reduced exposure time and significantly reduced undercutting of the tie bars, thus yielding narrow but strong tie bars.

BRIEF DESCRIPTION OF THE DRAWINGS

The features of the present invention which are believed to be novel are set forth with particularity in the appended claims. The invention, together with further objects and advantages thereof, may be best understood by reference to the following description taken in conjunction with the accompanying drawings, in the several figures of which like reference numerals identify like elements, and in which:

FIGS. 1–5 are cross-sectional views of apertures etched in mask blanks by prior art processes;

FIG. 6 is a diagrammatic view of a cathode ray tube utilizing a typical slot-type shadow mask;

FIG. 7 is an enlarged view of a portion of the slot-type shadow mask in FIG. 6;

FIG. 8 is a portion of the slot-type shadow mask shown in FIG. 6, showing the three-dimensional curvature characteristics of the mask; and FIGS. 9–19 collectively show a process of etching a photoresist coated mask blank as disclosed in this invention.

DESCRIPTION OF THE PREFERRED EMBODIMENTS

FIG. 6 schematically depicts a portion of a color television cathode ray tube 1 having a color selection mask 2 of a type generally referred to as a slot mask. Portions of FIG. 6 have been shown with exaggerated dimensions to more clearly show the interrelationship between the color selection mask, the slots 4 on that mask and the other portions of the cathode ray tube.

FIG. 7 is an enlarged view of the portion of the slot mask 2 shown in FIG. 6. The mask 2 comprises a sheet of electrically conductive material such as steel having formed therein apertures or slots 4, separated by narrow sections of the mask, commonly referred to as tie bars 6, and slats 8 between the rows of slots 4. The mask 2 generally takes a spherical, bi-radial or other three-dimensional contour much like that portion of the color selection mask displayed in FIG. 8. As previously mentioned, the most common problem in the formation of apertures in the slot-type mask manufacturing process is the maintenance of structurally strong but narrow tie bars between the slots. Again, the tie bars 6 should be narrow enough to suppress moire'-type patterns on the cathode ray tube screen and reduce electron beam absorption, but strong enough to give structural support to the mask. Most conventional etching processes inadequately control the size, shape and profile of the slots and consequently the resulting tie bars between the slots.

One method of etching electron-transmissive apertures in the manufacture of color selection masks, as shown schematically in FIGS. 9–19, in accordance with the invention preferably utilizes a laminated, etchable, and electrically conductive flat blank of metal, 120 in FIG. 10. It is preferable to utilize an electrically conductive, laminated flat blank 120 comprising a substrate layer 138, hereinafter called the substrate 138, and an aperture-defining layer 136. In the preferred embodiment the substrate comprises an approximately 6 mil thick layer of steel and the aperture-defining layer 136, hereinafter called the aperture layer, comprises a nominal ½ mil thick layer of nickel, the two either being bonded together or the nickel being plated on the steel substrate layer.

Preferably the first step in the manufacturing process is preforming the blank into a generally three-dimensional shape according to any of a number of well-known mask forming methods, for example a forming method as conceptually illustrated in FIG. 9. The blank may be formed by a stamping process wherein the aperture layer 136 is on the concave side of the blank 120 after the forming process and the substrate 138 is on the convex side of the blank after the forming process. Any type of stamping or drawing process may be used which will adequately preform the blank into a generally spherical, bi-radial, or other desired contour. As illustrated in FIG. 9, a movable force F may be applied to the aperture layer side of the blank, forcing the blank as a whole to take the form of both the force applying member 119 and a stationary member 121.

In the preferred embodiment, FIG. 10, the preformed blank 120 is first coated on its concave surface with a negative-working photoresist 122, for example, a Norland sensitized photoresist. A negative master 124, i.e., a stencil that is a negative of the desired end-product color selection mask, FIG. 11, having a first predetermined pattern of openings through which light may be transmitted, and the negative-working photoresist-coated blank are placed on the lighthouse. Ultraviolet radiation actinic to the negative photoresist is projected through the stencil onto the photoresist-coated blank and thus establishes a first illumination pattern of unexposed, ultimate sized and shaped elements, which substantially correspond to the opaque areas on the negative master 124, on the negative photoresist layer 122. Each and all of the unexposed elements are separated from all other corresponding elements by exposed photoresist. The exposed areas of the negative photoresist layer corresponding to the openings in the negative master are polymerized by the actinic rays. A suitable developer solution, FIG. 12, may then be applied to the photoresist-coated blank, washing away the non-polymerized soluble areas of the photoresist, that is, those areas not subjected to the light, establishing a first preselectd array of aperture elements 128 in the photoresist layer having the ultimate desired size and shape, hereafter called ultimate aperture elements.

The negative-working photoresist-coated, exposed and developed blank 120 is then preferably post baked at approximately 500°F for approximately 10 minutes and then coated with a positive-working photoresist 130, for example Shipley's AZ 1350 positive-working photoresist. See FIG. 13. A positive master 132, i.e., a stencil that is a positive of the desired color selection mask, FIG. 14, having a distribution of openings substantially similar to the opaque areas on the negative master 124, FIG. 11, and the twice photoresist-coated blank 120 are placed on a lighthouse. On exposure to light, which may be the same light source 126, actinic to the positive photoresist, a second preselected illumination pattern of elements, whose distribution substantially corresponds to both the first array of aperture elements 128 in the first photoresist coating and to the desired pattern of electron-transmissive apertures ultimately to be formed in the color selection mask, is formed on the positive photoresist layer 130, FIG. 15. A predetermined number of the elements may be substantially smaller than their respective counterparts formed in the negative photoresist layer 122 during the previous exposing and developing operation.

To achieve a specific end conventional coating requirements have dictated the use of a substantially thicker coating application of positive photoresist in comparison to a much thinner application of negative photoresist which produces the same result. However, in the preferred embodiment the negative photoresist coating on the blank serves as a buffer and permits a substantially thinner than typical layer of positive photoresist to be coated on top of the negative photoresist layer yet maintaining the desirable end result.

Being substantially thinner than the typical positive photoresist coating applied directly onto a metal electrode blank, a shorter exposure time may be used to expose the positive photoresist layer 130. On exposure, the exposed illumination pattern elements in the positive photoresist layer are depolymerized by the light source actinic to the photoresist. A developer solution, see FIG. 15, preferably a caustic base solution, washes away the depolymerized areas of the positive photoresist, forming in the positive photoresist layer 130 a second preselected array of aperture elements substantially superimposed over the first preselected array of aperture elements in the negative photoresist layer. The aperture elements in the second array are preferably distributed according to both the first preselected array of aperture elements and the ultimate desired apertures to be formed in the mask and each having a preliminary size and shape, hereafter called preliminary aperture elements.

On the concave surface of the electrode blank 120, FIG. 15, is an etchant-resistant structure comprising a coating of polymerized negative photoresist 122 having an array of ultimate sized and shaped aperture elements 128 therein. Covering the negative photoresist 122 and the array of ultimate aperture elements 128 is a coating of positive non-depolymerized photoresist 130 having an array of preliminary sized and shaped aperture elements 134 corresponding in distribution to the array of aperture elements 128 in the negative photoresist layer 122, FIG. 12. However, a predetermined number of these preliminary aperture elements 134 are substantially smaller than the aperture elements 128 formed in the negative photoresist layer. An etchant which may be ferric chloride having a concentration of 42 Baume', is sprayed from a battery of etchant spraying heads onto the concave side of the electrode blank 120, at approximately 25 psi for approximately 1½ minutes, etching the aperture-defining layer 136 and the substrate layer 138 according to the preliminary aperture elements 134 formed in the positive photoresist layer 130. The etchant chemically attacks those bared areas of the nickel aperture layer, forming in the blank a pattern of sharply rectangular preliminary shaped apertures 134, hereafter referred to as preliminary apertures.

In the preferred embodiment of a 1½ minute spray of etchant etches through the nominal ½ mil layer of nickel and approximately 2 to 3 mils of the 6 mil substrate 138. As the etchant etches through the substrate 138, undercutting of the aperture layer 136 occurs at the rate of about 2:1, i.e., for every mil of through etching, approximately .5 mil of lateral etching or undercutting occurs.

After the ferric chloride etchant is applied for approximately 1½ minutes, a second etchant, preferably ferric sulfate, 35%–40% by weight, is sprayed from a battery of spraying heads onto the partially etched apertures to finish etching through the substrate 138 of steel. The nickel aperture-defining layer 136 used in the preferred embodiment is virtually insoluble in the ferric sulfate etchant, thus virtually no etching of the aperture-defining layer occurs during the ferric sulfate etchant application, most of the etching being through the remaining 3 to 4 mils of the steel substrate 138. The etching operation in the steel substrate 138 preferably forms apertures 140 having the ultimate desired size, hereafter referred to as ultimate apertures.

After the preliminary apertures 134 are formed in the aperture layer and the ultimate apertures 140 are formed in the substrate, a concentrated solution of developer is used to flood the blank's surface to strip the remaining positive photoresist 130, FIG. 17, leaving the layer of polymerized negative photoresist 122 and the array of ultimate aperture elements in the negative photoresist layer. The array in the negative photoresist layer is typified both by the preliminary etched apertures and, around each preliminary etched aperture 134, by a narrow bare rim 142 of the aperture-defining layer. See FIG. 17.

Again an etchant, preferably a concentration of ferric chloride as used in the first etching step, is applied to the electrode blank surface, etching the rim 142 of the aperture layer surrounding the preliminary apertures, forming the ultimate apertures 128 in the aperture-defining layer 136. See FIG. 18.

A caustic base solution may then be applied to the blank surface, FIG. 19, stripping the remaining polymerized negative photoresist from the blank surface. The finished mask is then prepared for mounting in a cathode ray tube face-plate.

Virtually all detectable undercutting occurs during the first process of ferric chloride and ferric sulfate etching, with very little, if any, undercutting occurring during the second ferric chloride etching operation, thus the substrate is left substantially the same as it was prior to the second application of the ferric chloride. This is largely due to three things: (1) primarily the fact that once the etchant has penetrated the substrate, lateral etching is greatly minimized, (2) the short time (approximately 10 seconds) the etchant is allowed to remain on the blank, and (3) the relative thinness (nominally ½ mil) of the aperture layer 136.

These ultimate shaped apertures 128 in the aperture layer 136 sharply define the tie bars in the aperture layer 136. The tie bars in the substrate 138 are defined by the first etching operation, during which most of the etching in the substrate is caused to occur. The slot-mask manufacturing process is started by etching a preliminary aperture, smaller than desired, through the blank. The lateral etching or undercutting is designed according to a predetermined specification to yield a desired size tie bar in the substrate 138. The second etching operation is performed on a precisely specified area of the aperture layer 136 which preferably corresponds to the pattern of preliminary apertures forming apertures in the aperture layer with specifically designed tie bars between them.

The predetermined design of the tie bars is dictated by both the preference of having narrow tie bars to reduce moire' patterns and increase mask transmission and by the desirability that the mask be structurally strong as well. As discussed in the Background of the Invention, undercutting of the aperture layer is the most significant problem in maintaining narrow, yet strong, tie bars.

The process has designed within its steps controlled etching and undercutting, causing narrow, yet strong tie bars to be formed between the slot apertures.

The principles of this invention have application other than as described above, for example, in the manufacture of negative guardband cathode ray tube mask-screen assemblies.

The invention as herein disclosed may be utilized in the photoscreening operation on a color CRT faceplate, in the sense that the color selection mask manufactured in accordance with the invention is utilized as a stencil for the photo-screening operation.

In accordance with the invention, an etchable electrically conductive blank is provided preferably having a substrate onto which is disposed a relatively thin aperture-defining layer which may either be plated on the substrate layer or bonded to said substrate layer. As in the preferred embodiment the substrate may be composed of steel and the aperture-defining layer plated or bonded thereon may be of nickel or other suitable material.

The blank is preferably preformed into a generally three-dimensional contour typically a spherical or compound radial contour corresponding generally to the curvature of the associated cathode ray tube faceplate. As set forth in other embodiments described herein, the forming of the mask blank may be according to any well-known mask blank forming processes.

In accordance with the invention the formed blank is preferably coated with a coating of negative-working photoresist material on its concave aperture-defining layer. The coating is first exposed through a stencil (master) which is a negative of the aperture pattern on the desired end-product electron-transmissive color selection mask. The first exposure establishes an illumination pattern on the negative photoresist coating having unexposed pattern elements which are distributed according to the electron-transmissive apertures in the end-product mask. It is preferable that each of the individual pattern elements be sized according to the desired aperture size in the end-product mask and be separated from all other unexposed pattern elements by exposed photoresist material.

A developer which may be the same developer as used in the afore-described method is used to develop the exposed photoresist establishing an array of aperture elements in the photoresist coating which correspond to the first illumination pattern formed in the first photoresist coating. A second coating of photoresist material, preferably, a positive-working photoresist, is applied on the surface of the first coating of exposed photoresist and on the array of aperture elements established in the first photoresist coating.

The second photoresist coating may be exposed establishing a second preselected illumination pattern having exposed pattern elements corresponding in distribution to both the first array of aperture elements and to the desired pattern of electron-transmissive apertures in the end-product color selection mask. A predetermined group of the latter established pattern elements are generally of a smaller size than the desired mask aperture size in the end-product color selection mask. The reason for causing the second pattern elements to be smaller than the desired ultimate mask aperture size will become evident as this description proceeds.

These second pattern elements may be developed with a developer, which again may be the same as previously disclosed, establishing a second array of aperture elements in the second photoresist coating. The second array of aperture elements is substantially superimposed over the first array of aperture elements but generally each of the individual elements in the said predetermined group is a smaller size than the aperture elements established in the first photoresist coating. The distribution pattern of both the first and second array of aperture elements is substantially coincident and corresponds to the desired pattern of electron-transmissive apertures in the end-product mask.

The blank may be etched with a suitable etchant, first according to the second array of generally smaller aperture elements, establishing in the aperture-defining layer apertures hereinafter referred to as preliminary apertures which are of a generally smaller size relative to the desired size of electron-transmissive apertures in the end-product mask and which relate in size to the size of the phosphor elements to be screened on the faceplate, as will be explained in detail below. The etching operation also establishes in the substrate layer apertures generally having the desired size of the electron-transmissive apertures in the end-product mask. Each of the apertures established in the substrate layer respectively undercut the corresponding preliminary apertures in the aperture-definning layer.

The once-etched blank, having established therein preliminary apertures in the aperture-defining layer is used as a photographic stencil for photoscreening on a cathode ray tube faceplate a pattern of phosphor elements. The distribution of the phosphor elements correspond substantially to the distribution of the preliminary aperture-defining layer apertures and their respective size is closely related to the size of the preliminary apertures. In the case of screens of the type having a black grille, the mask blank is employed first to assist in defining the size and distribution of the openings in the black grille, and then to assist in the deposition of phosphor elements in the grille openings.

After the photoscreening operation, a suitable solvent is used to remove the second photoresist coating which leaves the first photoresist coating having the first array of aperture elements formed therein.

In accordance with this invention, the aperture-defining layer is again etched this time according to the array of aperture elements originally formed in the aperture-defining layer. The electron-transmissive apertures in the aperture-defining layer are established by this etching operation, each preferably having the ultimate desired size and shape and distribution and each respectively have reduced undercutting in the substrate layer.

The finished electron-transmissive color selection mask may then be suspended adjacent to the cathode ray tube faceplate. A predetermined group of the phosphor elements on the cathode ray tube faceplate corresponding to the said predetermined group of preliminary apertures in the in-process mask are smaller in size than the electron beam landings defined by the electron beam being projected through the corresponding electron-transmissive apertures. The electron beam landings are larger than the impinged phosphor elements by an alotted (negative) tolerance value in any direction in which misregistration between the beam landings and the phosphor elements might cause color impurities in the reproduced images.

The invention is not limited to the particular details of construction of the embodiments depicted and other modifications and applications are contemplated. Certain changes may be made in the above-described methods without departing from the true spirit and scope of the invention herein involved. It is intended therefore that the subject matter in the above depiction shall be interpreted as illustrative and not in a limiting sense.

What is claimed is:

1. For use in the manufacture of color selection masks for color television cathode ray tubes, a method of forming electron-transmissive apertures having a predetermined size, shape and distribution in a color selection mask, said method comprising:

providing an etchable, electrically conductive blank having a substrate layer on which is disposed an aperture-defining layer;

applying a first coating of negative-working photoresist material on said aperture-defining layer;

exposing the first photoresist coating through a preselected stencil forming in said photoresist coating a first preselected illumination pattern with unexposed pattern elements distributed according to the desired pattern of electron-transmissive apertures to be ultimately formed in said mask, said pattern elements having the desired ultimate mask aperture size, each and all of said unexposed pattern elements separated from all other unexposed pattern elements by exposed photoresist material;

developing the exposed first photoresist coating forming a first preselected array of aperture elements in said first photoresist coating corresponding to sid first illumination pattern;

applying a second coating of positive-working photoresist material on said first coating of exposed photoresist and on said first array of aperture elements in said first photoresist coating;

exposing said second photoresist coating in a second preselected illumination pattern with exposed pattern elements corresponding in distribution both to said first preselected array of aperture elements formed in said first photoresist coating and to the desired pattern of electron-transmissive apertures to be ultimately formed in said mask, a predetermined group of said second pattern elements being a smaller size than the desired ultimate mask aperture size;

developing the exposed pattern of elements in the second photoresist coating, forming a second preselected array of aperture elements in said second photoresist coating substantially superimposed over said first preselected array of aperture elements in said first photoresist coating and corresponding in distribution to both said first preselected array of aperture elements and to said desired pattern of electron-transmissive apertures to be ultimately formed in said electrically conductive blank, a predetermined group of said second array of aperture elements being a smaller size than the desired ultimate mask aperture size;

etching through the blank according to the second preselected array of aperture elements to form in said aperture-defining layer a pattern of preliminary apertures having, at least in a group of the apertures corresponding to said predetermined group of second pattern elements, a predetermined size which is smaller than a desired ultimate mask aperture size and to form in the substrate layer a pattern of ultimate sized and shaped apertures, each respectively undercutting the corresponding preliminary aperture in the aperture-defining layer;

removing said second photoresist coating, baring said first photoresist coating having said first preselected array of aperture elements formed therein; and etching through said aperture-defining layer according to the first preselected array of aperture elements to form in said aperture-defining layer electron-transmissive apertures having the desired size and shape and each respective electron-transmissive aperture in the blank having reduced undercutting in the substrate layer.

2. A method as defined in claim 1 wherein said aperture-defining layer is relatively thin in comparison to said substrate layer.

3. A method as defined in claim 1 wherein said color selection mask is preformed into a three-dimensionally curved configuration prior to application of the photoresist coating.

4. A method in accordance with claim 3 wherein said preformed mask is formed from a flat blank to assume a generally spherical or multi-radial contour.

5. A method as defined in claim 3 wherein said blank is comprised of a bi-metal system including said aperture-defining layer on the concave side of the blank being nominally about ½ mil thick and said substrate layer being nominally about 6 mils thick.

6. A method in accordance with claim 5 wherein said forming of said apertures is accomplished by etching from the concave side of said contoured, preformed color selection mask.

7. For use in the manufacture of slot-type color selection masks for color television cathode ray tubes, a method of forming sharply rectangular electron-transmissive dot-type apertures having strong tie bars and a predetermined distribution in a color selection mask, said method comprising:

providing a preformed, three-dimensionally curved, etchable electrically conductive blank having a substrate layer of a predetermined thickness on which is disposed an aperture defining layer of nominal thickness in comparison to said substrate layer;

applying a first coating of negative-working photoresist material on said aperture-defining layer;

exposing the first photoresist coating through a preselected stencil forming in said photoresist coating a first preselected illumination pattern with unexposed pattern elements distributed according to the desired pattern of electron-transmissive apertures to be ultimately formed in said mask, said pattern elements having the desired ultimate mask aperture size, each and all of said unexposed pattern elements separated from all other pattern elements by exposed photoresist material;

developing the exposed first photoresist coating forming a preselected array of aperture elements in said first photoresist coating corresponding to said first illumination pattern;

applying a second coating of positive-working photoresist material on said first coating of exposed photoresist and on said first array of aperture elements in said first photoresist coating;

exposing said second photoresist coating in a second preselected illumination pattern with exposed pattern elements corresponding in distribution both to said first preselected array of aperture elements formed in said first photoresist coating and to the desired pattern of electron-transmissive apertures to be ultimately formed in said mask, a predetermined group of said second pattern elements being a smaller size than the desired ultimate mask aperture size;

developing the exposed pattern of elements in the second photoresist coating, forming a second preselected array of aperture elements in said second photoresist coating substantially superimposed over said first preselected array of aperture elements in said first photoresist coating and corresponding in distribution to both said first preselected array of aperture elements and to said desired pattern of electron-transmissive apertures being ultimately formed in said preformed electrically conductive blank, a predetermined group of said second array of aperture elements being a smaller size than the desired ultimate mask aperture size;

etching through from the concave side of said preformed blank according to the second preselected array of aperture elements to form in said aperture-defining layer a pattern of preliminary apertures having at least in a group of the apertures corresponding to said predetermined group of second pattern elements, a predetermined size which is smaller than a desired ultimate mask aperture size and to form in the substrate layer a pattern of ultimate sized and shaped apertures, each respectively undercutting the corresponding preliminary aperture in the aperture-defining layer;

removing said second photoresist coating baring said first photoresist coating having said first preselected array of aperture elements formed therein; and etching through said aperture-defining layer according to the first preselected array of aperture elements to form in said aperture-defining layer electron-transmissive apertures having the desired size and shape and each respective electron-transmissive aperture in the blank having reduced undercutting in the substrate layer, whereby a slot-type color selection mask having sharply rectangular electron-transmissive, slot-type apertures vertically separated by narrow but strong tie bars is manufactured.

8. For use in the manufacture of negative guardband type color television cathode ray tubes, the method comprising:

providing an etchable, electrically conductive blank having a substrate layer on which is disposed an aperture-defining layer;

applying a first coating of negative-working photoresist material on said aperture-defining layer;

exposing the first photoresist coating through a preselected stencil forming in said photoresist coating a first preselected illumination pattern with unexposed pattern elements distributed according to the desired pattern of electron-transmissive apertures to be ultimately formed in said mask, said pattern elements having the desired ultimate mask aperture size, each and all of said unexposed pattern elements separated from all other unexposed pattern elements by exposed photoresist material;

developing the exposed first photoresist coating forming a first preselected array of aperture elements in said first photoresist coating corresponding to said first illumination pattern;

applying a second coating of positive-working photoresist material on said first coating of exposed photoresist and on said first array of aperture elements in said first photoresist coating;

exposing said second photoresist coating in a second preselected illumination pattern with exposed pattern elements corresponding in distribution both to said first preselected array of aperture elements formed in said first photoresist coating and to the desired pattern of electron-transmissive apertures to be ultimately formed in said mask, a predetermined group of said second pattern elements being a smaller size than the desired ultimate mask aperture size;

developing the exposed pattern of elements in the second photoresist coating, forming a second preselected array of aperture elements in said second photoresist coating substantially superimposed over said first preselected array of aperture elements in said first photoresist coating and corresponding in distribution to both said first preselected array of aperture elements and to said desired pattern of electron-transmissive apertures to be ultimately formed in said electrically conductive blank;

etching through the blank according to the second preselected array of aperture elements, to form in said aperture-defining layer a pattern of preliminary apertures having, at least in a group of the apertures corresponding to said predetermined group of second pattern elements, a predetermined size which is smaller than a desired ultimate mask aperture size and to form in the substrate layer a pattern of ultimate sized and shaped apertures, each respectively undercutting the corresponding preliminary aperture in the aperture-defining layer;

while utilizing said etched blank having preliminary apertures as a photographic stencil, photoscreening on a cathode ray tube faceplate a pattern of phosphor elements having the distribution of the prelimiary mask blank apertures and respective element size closely related to the size of said preliminary apertures;

removing said second photoresist coating, baring said first photoresist coating having said first preselected array of aperture elements formed therein; and etching through said aperture-defining layer according to the first preselected array of aperture elements to form in said aperture-defining layer electron-transmissive apertures having the desired size and shape and each respective electron-transmissive aperture in the blank having reduced undercutting in the substrate layer; and suspending said color selection mask having ultimate sized and shaped apertures adjacent the faceplate, at least, the electron-transmissive apertures associated with said phosphor elements which are in turn associated with said predetermined group of aperture elements being of a size such that the electron beam landings defined thereby are larger than the impinged phosphor elements by an allotted tolerance value in any direction in which misregistration between beam landing and phosphor elements might cause reproduced color impurity.

* * * * *